United States Patent
Hutchinson

(10) Patent No.: US 7,602,325 B2
(45) Date of Patent: Oct. 13, 2009

(54) SIGMA DELTA ANALOG TO DIGITAL CONVERTER WITH INTERNAL SYNCHRONOUS DEMODULATION

(75) Inventor: Andrew Hutchinson, Williamsburg, VA (US)

(73) Assignee: General Electric Company, Schenectady, NY (US)

( * ) Notice: Subject to any disclaimer, the term of this patent is extended or adjusted under 35 U.S.C. 154(b) by 151 days.

(21) Appl. No.: 11/966,138

(22) Filed: Dec. 28, 2007

(65) Prior Publication Data

US 2009/0167580 A1   Jul. 2, 2009

(51) Int. Cl.
*H03M 3/00* (2006.01)

(52) U.S. Cl. .................. 341/143; 341/122; 341/155; 341/172

(58) Field of Classification Search .......... 341/188–125
See application file for complete search history.

(56) References Cited

U.S. PATENT DOCUMENTS

| | | | |
|---|---|---|---|
| 4,833,474 A * | 5/1989 | Nagai et al. ................. 341/166 |
| 5,148,166 A | 9/1992 | Ribner |
| 5,477,481 A | 12/1995 | Kerth |
| 5,729,225 A * | 3/1998 | Ledzius ........................ 341/61 |
| 5,841,822 A | 11/1998 | Mittel |
| 5,914,592 A * | 6/1999 | Saito ....................... 324/121 R |
| 6,204,787 B1 | 3/2001 | Baird |
| 6,307,498 B1 * | 10/2001 | Eglit .......................... 341/155 |
| 6,342,849 B1 * | 1/2002 | Fujiwara ...................... 341/132 |
| 6,452,518 B1 * | 9/2002 | Kawabata .................... 341/118 |
| 6,856,266 B2 * | 2/2005 | Clement et al. ............. 341/143 |
| 7,039,436 B1 * | 5/2006 | Kakehi ........................ 455/525 |
| 7,230,458 B2 * | 6/2007 | DaDalt ........................ 327/113 |
| 7,315,601 B2 * | 1/2008 | Fontaine et al. ............. 375/375 |
| 7,420,426 B2 * | 9/2008 | Herrin et al. ................. 331/1 A |
| 7,498,957 B2 * | 3/2009 | De Buys ........................ 341/61 |
| 2006/0250283 A1 * | 11/2006 | Lin .............................. 341/50 |

\* cited by examiner

*Primary Examiner*—Linh V Nguyen
(74) *Attorney, Agent, or Firm*—GE Global Patent Operation

(57) ABSTRACT

A sigma-delta (ΣΔ) analog to digital converter with internal synchronous demodulation responsive to a sample clock, reference clock and conversion clock including a sample switching circuit responsive to an AC input to sample the AC input at the sample clock rate; the sample switching circuit including first and second input switches responsive to the reference clock for selectively, alternately sampling the positive and the negative AC input at the reference clock rate; and an inverter circuit responsive to the reference clock and the sample clock for reversing the polarity of signals from the sample clock in synchronism with the reference clock to reverse the sense of the input switches and synchronously demodulating the AC input within the converter.

4 Claims, 2 Drawing Sheets

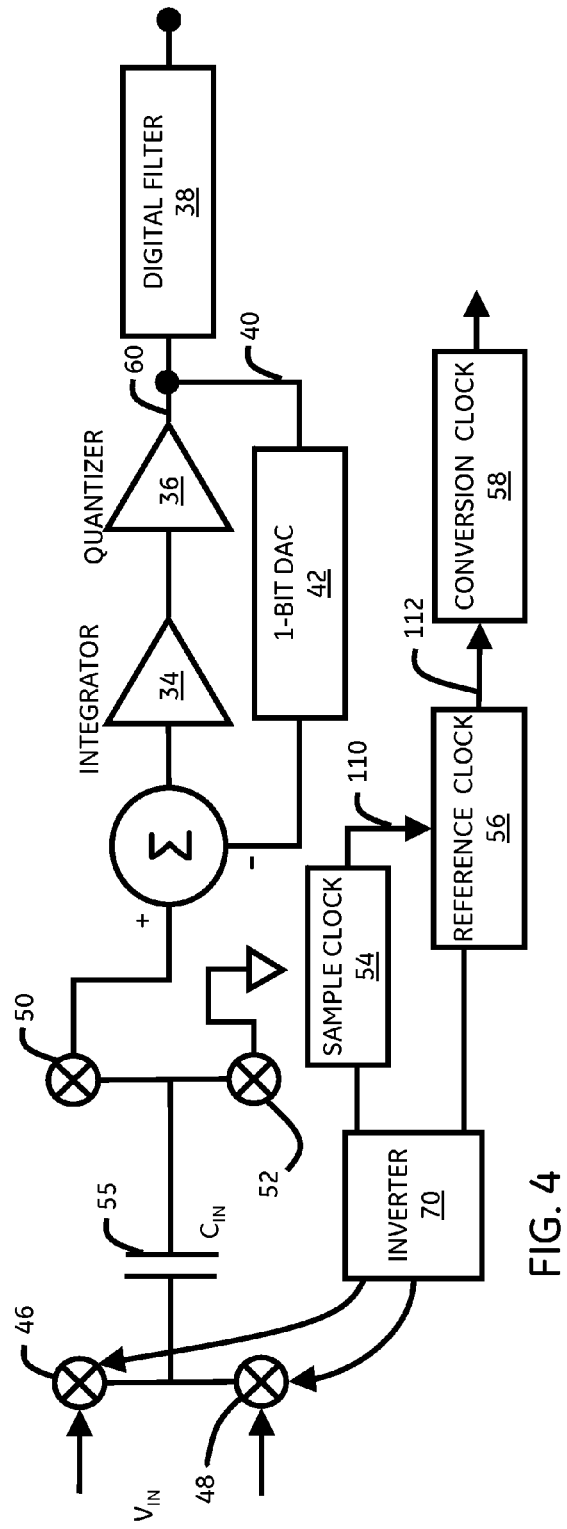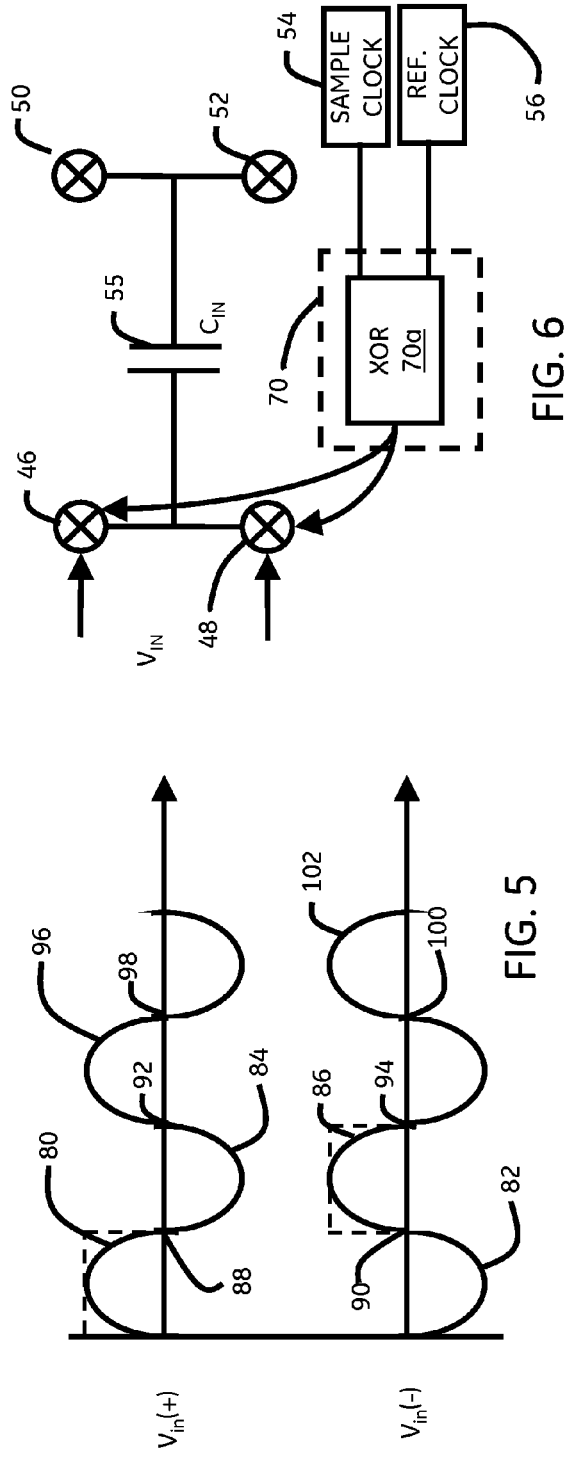

SIGMA DELTA ANALOG TO DIGITAL CONVERTER WITH INTERNAL SYNCHRONOUS DEMODULATION

FIELD OF THE INVENTION

This invention relates to sigma-delta (ΣΔ) analog to digital converter with synchronous demodulation.

BACKGROUND OF THE INVENTION

Alternating current (AC) signals such as those from inductive or capacitive sensors benefit greatly from the use of phase sensitive synchronous demodulation to obtain amplitude information. This method provides a high degree of filtering of extraneous noise outside the frequency and phase of the required signal. A typical input signal chain is compromised of three main elements: synchronous demodulator, filter and analog to digital converter. Although there are several variations, the classic method of implementing a demodulator is to use a switch controlled by the reference oscillator. This switch switches alternately between the input signal and its inverse to produce a synchronously rectified result. The phase timing of this switch is set to produce a full or half wave rectified version of the AC signal. Phase adjustment maybe included to enhance signal fidelity such as removing unwanted phase shifts in the signal path. Switching must be fast, exact and the effects of switch resistance or amplitude imperfections may degrade overall system performance.

Filtering of the rectified signal has to maintain fidelity and bandwidth for the signal of interest, while ripple must be minimized, consequently the analog filter circuit is often complex and limits the overall performance of the measurement system.

Alternate methods have been used where a digital signal processor is used to digitize the AC signals and then perform demodulation and filtering in software. This overcomes some of the filtering limitations but in doing so requires the use of more complex and costly high speed digital to analog converters and digital signal processor (DSP) hardware.

SUMMARY OF THE INVENTION

An improved sigma-delta (ΣΔ) analog to digital converter with internal synchronous demodulation in accordance with this invention is easily implemented internally in the converter. The ΣΔ analog to digital converter is simple and inexpensive to implement and fabricate and avoids the need for a preliminary demodulator or low pass filter. The ΣΔ analog to digital converter uses a small but elegant change in operation of the converter input switches to effect the synchronous demodulation and permits a complete filtering of the AC ripple by the conventional digital filter associated with the converter.

A ΣΔ analog to digital converter can be accomplished simply and effectively within the converter by periodically reversing the sense of the converter input switches in time with the reference clock to synchronously demodulate the AC input.

The subject invention, however, in other embodiments, need not achieve all these objectives and the claims hereof should not be limited to structures or methods capable of achieving these objectives.

This invention features a ΣΔ analog to digital converter with internal synchronous demodulation responsive to a sample clock, reference clock and conversion clock. A sample switching circuit is responsive to an AC input to sample the AC input at the sample clock rate. The sample switching circuit includes first and second input switches responsive to the reference clock for selectively, alternately sampling the positive and the negative AC input at the reference clock rate. An inverter circuit responsive to the reference clock and the sample clock reverses the polarity of signals from the sample clock in synchronism with the reference clock to reverse the sense of the input switches and synchronously demodulate the AC input within the converter.

In a preferred embodiment the inverter may include an exclusive OR gate whose inputs are the reference clock and the sample clock. The sample clock may have a higher rate than the reference clock and the reference clock may have a higher rate than the conversion clock. The conversion clock rate may be a whole number of half cycles of the reference clock.

BRIEF DESCRIPTION OF THE DRAWINGS

Other objects, features and advantages will occur to those skilled in the art from the following description of a preferred embodiment and the accompanying drawings, in which:

FIG. 4 is a schematic block diagram of a ΣΔ analog to digital converter system with internal synchronous demodulation according to this invention;

FIG. 5 is a schematic block diagram of one implementation of the inverter of FIG. 4; and FIG. 6 illustrates the inherently rectifying effect of the inverted operation of the input switches of FIG. 4.

DETAILED DESCRIPTION OF THE INVENTION

Figure 1:
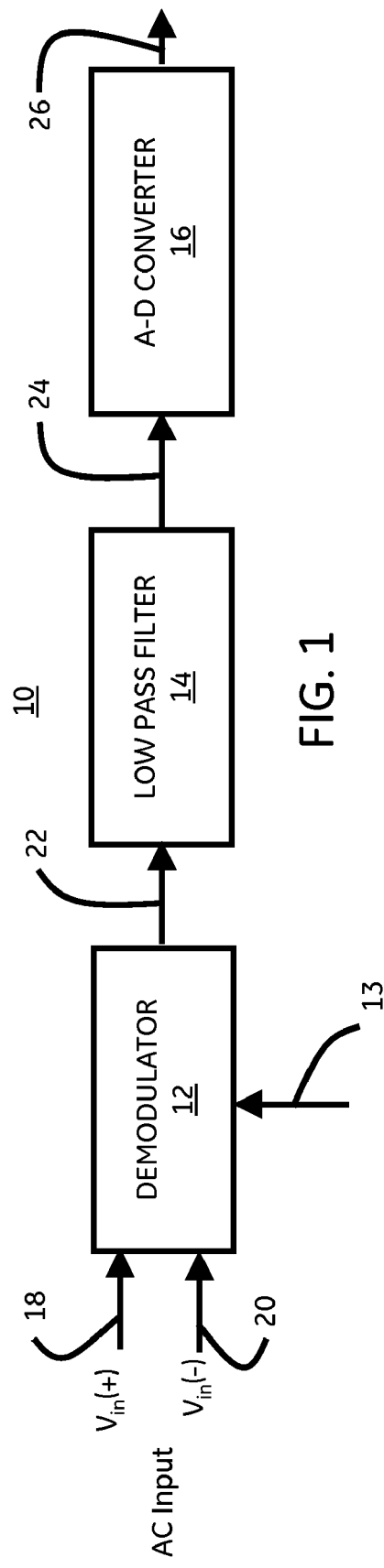
FIG. 1 is a schematic block diagram of a prior art synchronous demodulation analog to digital conversion system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 3:
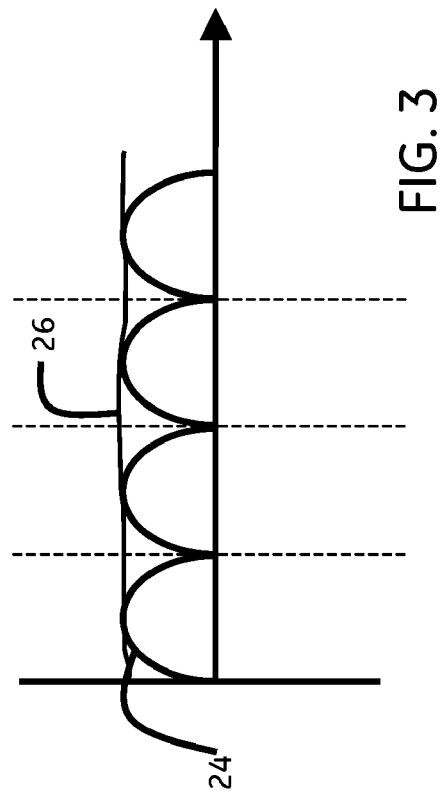
FIG. 3 illustrates a typical rectified waveform produced by the demodulator for the AC input in FIG. 2.
Figure 2:
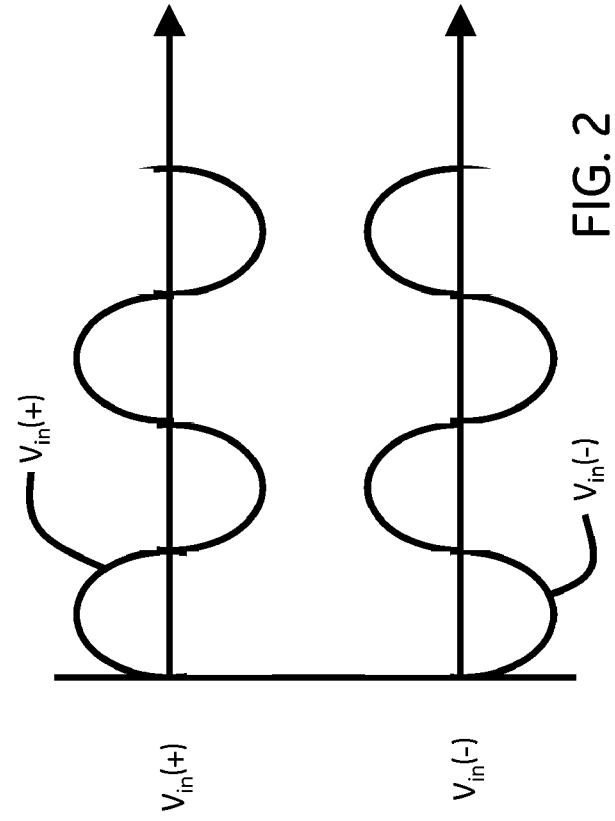
FIG. 2 illustrates a typical AC input $V_{in(+)}$, $V_{in(-)}$ to the demodulator of FIG. 1.

There is shown in FIG. 1 a conventional analog to digital converter system 10 with synchronous demodulation typically includes a demodulator 12, low pass filter 14, and analog to digital converter 16. The AC inputs $V_{in(+)}$ and $V_{in(-)}$ at 18 and 20 are fed to demodulator 12 where they are synchronously demodulated or rectified with respect to the reference clock 13 and the rectified output appears at output 22. Typically the input AC waves $V_{in(+)}$ and $V_{in(-)}$ are 180° out of phase as shown in FIG. 2. After demodulation or rectification they appear as shown by the demodulated waveform 24, FIG. 3 and after passing through low pass filter 14 the output 24 to analog to digital converter 16, FIG. 1, appears as a low ripple DC level 26, FIG. 3. This conventional approach requires a separate demodulator, and analog low pass filter to prepare the AC input signal for submission to the analog to digital converter 16. Low pass filter 14 removes some but not all of the ripple from the output signal.

A ΣΔ analog to digital converter system with internal synchronous demodulation 30, FIG. 4, includes an analog to digital converter which is shown as a ΣΔ converter 16a with conventional components including a summing circuit 32, integrator circuit 34, quantizer 36, digital filter 38, and feedback loop 40 which includes one bit DAC 42. There is also shown in system 30 a sample switching circuit 44 which includes input switches 46 and 48 and output switches 50 and 52. In this case the input is capacitively coupled using capacitor 55. Also conventionally associated with converter 16a are a sample clock 54, reference clock 56, and conversion clock 58. Sample clock 54 is a high rate clock, e.g. 3 MHz which operates switches 46, 48, 50, and 52 and defines the sampling rate of the converter system. Reference clock 56 is a lower frequency clock, for example, 5 kHz. Conversion clock 58 is an even lower rate clock, for example, 1000 Hz which defines the period of the conversion by sampling the output of the digital filter 38.

In conventional operation sample clock 54 operates switches 46, 48, 50 and 52 by, for example, opening switches 48 and 50 and closing switches 46 and 52 to charge capacitor 55 to $V_{in(+)}$ and then opening switches 46 and 52 and closing switches 48 and 50 to connect capacitor 55 to $V_{in(-)}$ and through switch 50 to input of summing circuit 32. Converter 16a operates in the conventional manner whereby the difference between the output of one bit DAC 42 and the input from switch 50 is integrated in integrator 34 then compared to some reference level in quantizer 36. For example, if it is above the level, a one appears on line 60; if it is below that predetermined level a zero appears there. That one or zero is fed back to one bit DAC 42 and also forward to digital filter 38. Conversion clock 58 is set by the decimation ration of the converter and determines how many of these filtered one/zero outputs will be regarded as a valid representation of the AC input.

In accordance with this invention without using a demodulator, such as demodulator 12 in FIG. 1, or a low pass filter such as low pass filter 14 in FIG. 1, the same demodulation can be effected simply by using an inverter 70, FIG. 4, which periodically changes the sense of input switches 46 and 48 according to the state of the reference clock 56. This can be done in the embodiment of FIG. 4 by inverting the polarity of the sample clocks upon the occurrence of a reference clock. Remember the sample clock occurs at 3 MHz in this specific example and the reference clock occurs at 5 kHz. But the simple expedient of reversing the sense of switches 46 and 48 responding to the sample clock each time a reference clock occurs, the AC inputs $V_{in(+)}$, $V_{in(-)}$ shown again in FIG. 5 are sampled in a selectively alternative fashion. For simplicity the frequency of $V_{in(+)}$ and $V_{in(-)}$ in FIG. 5 is shown as the reference clock frequency in a specific example 5 kHz. Without more, the switching would enable the positive portion 80 of $V_{in(+)}$ to be sampled and then the negative portion 82 of $V_{in(-)}$ to be sampled. Then the negative portion 84 of $V_{in(+)}$ and the positive portion of $V_{in(-)}$ 86. The result would be that the average value over time is zero, not a workable input for the converter. However, by inverting the sample clock each half cycle of the reference clock this can be avoided. Each time the inputs, which for simplicity have the same reference as the reference clock 56, go through zero such as at 88 and 90 the inverter 70 inverts the sample clock polarity. This reverses the sense of switches 46 and 48. Thus, after sampling a portion 80, instead of sampling portion 82 because of the inversion, it is the positive portion 86 of $V_{in(-)}$ that is sampled. So too at zero crossing 92 and 94 the sample portion is 96, a positive portion of $V_{in(+)}$, after zero crossing 98 and 100 the sample portion is the positive portion 102 of $V_{in(-)}$. Thus, by inverting the sample clock polarity every time a reference clock occurs a demodulated or rectified output occurs which has the same profile as at 24 in FIG. 3. And so the demodulation has been achieved with far fewer and less complex components. In addition this signal in a digital domain can be dealt with by digital filter 38 so that the ripple is not just substantially filtered out but can be actually completing filtered out. This can be done simply by making sure that the conversion clock 58 is a whole number multiple of a half cycle of reference clock 56. Since for this particular example sample clock 54 is 3 MHz, reference clock 56 is 5 kHz and conversion clock 58 is 1,000 Hz this is the case and the added advantage of the highly effective digital filtration is achieved. In fact the connection 110, FIG. 4, shown from the sample clock 54 to reference clock 56 and the connection 112 from reference clock 56 to conversion clock 58 represents that each lower clock is a reduction from the next higher clock and they are indeed whole multiples of one another.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not to be limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A sigma-delta (ΣΔ) analog to digital converter with internal synchronous demodulation responsive to a sample clock, reference clock and conversion clock comprising:
   a sample switching circuit responsive to an AC input to sample the AC input at the sample clock rate; said sample switching circuit including first and second input switches responsive to the reference clock for selectively, alternately sampling the positive and the negative AC input at said reference clock rate; and
   an inverter circuit responsive to said reference clock and said sample clock for reversing the polarity of signals from said sample clock in synchronism with said reference clock to reverse the sense of the input switches and synchronously demodulating the AC input within the converter.

2. The converter of claim 1 in which said inverter includes an exclusive OR gate whose inputs are said reference clock and said sample clock.

3. The converter of claim 1 in which said sample clock has a higher rate than said reference clock and said reference clock has a higher rate than said conversion clock.

4. The converter of claim 3 in which said conversion clock rate is a whole number of half cycles of said reference clock.

* * * * *